(12) United States Patent
Kasperkovitz et al.

(10) Patent No.: US 6,665,523 B1
(45) Date of Patent: Dec. 16, 2003

(54) RECEIVER TUNING SYSTEM

(75) Inventors: Wolfdietrich G. Kasperkovitz,
Eindhoven (NL); Cicero S. Vaucher,
Eindhoven (NL)

(73) Assignee: Koninklijke Philips Electronics N.V.,
Eindhoven (NL)

( * ) Notice: Subject to any disclaimer, the term of this patent is extended or adjusted under 35 U.S.C. 154(b) by 0 days.

(21) Appl. No.: 09/039,348

(22) Filed: Mar. 13, 1998

(65) Prior Publication Data (65)

(30) Foreign Application Priority Data

Mar. 18, 1997 (EP) .............................. 97200821

(51) Int. Cl.⁷ ................................ H04B 1/40
(52) U.S. Cl. .............. 455/76; 455/173.1; 455/180.3; 455/260; 331/2
(58) Field of Search .................. 455/76, 77, 255–259, 455/260, 265, 165.1, 173.1, 178.1, 180.3, 183.1, 183.2, 192.2, 192.3; 331/2, 16, 18, 25

(56) References Cited

U.S. PATENT DOCUMENTS

| 4,965,533 A | * | 10/1990 | Gilmore | 331/18 |
| 5,146,186 A | * | 9/1992 | Vella | 331/16 |
| 5,150,078 A | | 9/1992 | Yang et al. | 331/2 |
| 5,570,066 A | | 10/1996 | Eberhardt et al. | 331/34 |

OTHER PUBLICATIONS

"Recent developments in frequency synthesizers in Russia", A.I. Kabanov et al., 23rd European Microwave Conference Proceedings, p. 26–29, vol. 1, 1993.

* cited by examiner

Primary Examiner—Lee Nguyen
(74) Attorney, Agent, or Firm—Edward W. Goodman

(57) ABSTRACT

In a receiver, a frequency-synthesis circuit (SYNTH) generates a stepped-frequency signal (Ssf) having a frequency which can be varied in steps. A synchronization circuit (LOOP) synchronizes a tuning oscillator (LO) with the stepped-frequency signal (Ssf). It provides an integer frequency-relationship between the stepped-frequency signal (Ssf) and the tuning oscillator (LO). That is, if the stepped-frequency signal (Ssf) has a frequency Fsf, the tuning oscillator (LO) will operate at a frequency Flo=N·Fsf, N being an integer or an integer fraction.

6 Claims, 3 Drawing Sheets

RECEIVER TUNING SYSTEM

BACKGROUND OF THE INVENTION

1. Field of the Invention

The invention relates to a receiver having a tuning system in which a tuning oscillator is synchronized with a stepped-frequency signal having a frequency which can be varied in steps. The invention also relates to the tuning system as such, and to a method of tuning.

2. Background Art

DESCRIPTION OF THE INVENTION

U.S. Pat. No. 5,150,078 describes a prior-art frequency synthesizer for Doppler radar and communication receivers. The prior-art frequency synthesizer comprises two phase-locked loops (PLLs). The first PLL is a fine or VHF step-tuning loop which provides a fine frequency-step signal. The second or L-band PLL converts the fine frequency-step signal into an L-band frequency signal. It includes an L-band voltage- controlled oscillator (VCO) whose output signal is divided by two and then mixed with the third harmonic of a reference-frequency signal to generate an offset-frequency signal. The phase of the offset-frequency signal is compared with that of a frequency-divided version of the fine frequency-step signal. Accordingly, a phase-difference signal is obtained which controls the frequency and phase of the L-band VCO.

U.S. Pat. No. 5,150,078 gives the following example. The fine frequency-step signal has a frequency of 280 MHz. Its frequency is divided by five to obtain a 56 MHz signal. The L-band VCO provides a 1388 MHz output signal. Since this output signal is divided by two, a 694 MHz signal is obtained. The reference-frequency signal is at 250 MHz and, consequently, its third harmonic is at 750 MHz. Mixing the third harmonic with the 694 MHz signal provides sum and difference frequencies of which 750–694=56 MHz is selected for phase comparison.

SUMMARY OF THE INVENTION

An object of the invention is to provide a receiver which, with respect to the background art, allows a better performance in terms of interference-immunity.

This object is achieved in a tuning system comprising a frequency-synthesis circuit for generating a stepped-frequency signal having a frequency which can be varied in steps; and a synchronization circuit for synchronizing a tuning oscillator with the stepped-frequency signal, characterized in that the synchronization circuit is arranged to provide an integer frequency-relationship between the stepped-frequency signal and the tuning oscillator.

This object is further achieved in a receiver comprising a tuning system as described above.

This object is further achieved in a method of tuning comprising the steps of generating a stepped-frequency signal having a frequency which can be varied in steps; and synchronizing a tuning oscillator with the stepped-frequency signal; characterized in that the method of tuning comprises the step of providing an integer frequency-relationship between the stepped-frequency signal and the tuning oscillator.

The invention takes the following aspects into consideration. A receiver's performance, in terms of interference-immunity depends on the spectral purity of its tuning oscillator. This has the following reason. In practice, any receiver comprises at least one mixer circuit which receives a signal from the tuning oscillator. If the tuning oscillator signal comprises a spectral component which does not have the desired oscillator frequency, the mixer circuit will produce spurious mixing products which may cause interference. The interference may manifest itself as, for example, audible whistles in the case of analog AM and FM radio-reception, visual disturbances in the case of analog TV reception, or an increase in bit-error rate of the recovered information in the case of digital transmission.

The tuning oscillator's spectral purity may be adversely affected if a signal which does not stem from the tuning oscillator itself, leaks into the tuning oscillator. Such signal leakage may be due to, for example, capacitive or inductive coupling between the tuning oscillator and other circuitry in the receiver. The higher the frequency of the leaking signal, the stronger the coupling will be and, consequently, the greater the extent to which the spectral purity of the tuning oscillator will be affected. Furthermore, the nearer in frequency the leaking signal is with respect to the tuning oscillator frequency, the greater the extent to which the spectral purity of the tuning oscillator will be affected. In this respect, it should be noted that, in practice, a signal comprises various frequency components, such as, for example, a fundamental frequency component and harmonic frequency components.

In the background art, the stepped-frequency signal, which is provided by the first PLL, has a frequency of 280 MHz and, consequently, a 1400 MHz fifth harmonic. In practice, this 1400 MHz fifth harmonic will leak into the L-band VCO which has a 1388 MHz oscillation frequency. As a result, the L-band VCO will be parasitically modulated with a 12 MHz frequency which is the difference between the 1388 MHz oscillation frequency and the 1400 MHz fifth harmonic. The L-band VCO's signal will therefore comprise a 1376 MHz frequency component and a 1400 MHz frequency component. If the L-band VCO drives a mixer circuit for converting input signals in frequency, an input signal whose frequency differs 12 MHz from that of the desired signal will be converted to the same frequency as the desired signal and, consequently, will cause interference.

In accordance with the invention, an integer frequency-relationship between the tuning oscillator and the stepped-frequency signal is provided. If the stepped-frequency signal or any of its harmonics leaks into the tuning oscillator, this will not result in any parasitic modulation because of the integer-frequency relationship. In contradistinction to the background art, such signal leakage will, thus not adversely affect the tuning oscillator's spectral purity. Consequently, the invention allows a higher spectral purity of the tuning oscillator and, thus provides a receiver which has a better performance in terms of interference-immunity.

The invention and additional features, which may be optionally used to implement the invention to advantage, are apparent from and will be elucidated with reference to the drawings described hereinafter.

DETAILED DESCRIPTION OF THE DRAWINGS

First, some remarks are made on the use of reference signs. Similar entities will be denoted by an identical lettercode throughout the drawings. Various similar entities may be shown in a single drawing. In that case, a numeral will be added to the lettercode to distinguish similar entities from each other. The numeral will be placed between parentheses if the number of similar entities is a running parameter. In the description and in the claims, any numeral in a reference sign may be omitted if this is appropriate.

Figure 1:
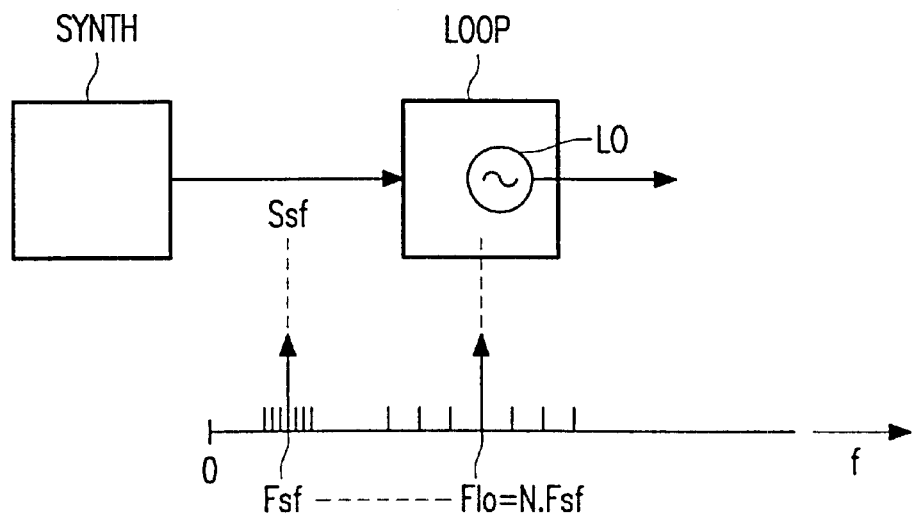
FIG. 1 is a conceptual diagram illustrating basic features of the invention.

FIG. 1 illustrates basic features of the invention. A frequency-synthesis circuit SYNTH generates a stepped-frequency signal Ssf whose frequency can be varied in steps. A synchronization circuit LOOP synchronizes a tuning oscillator LO with the stepped-frequency signal. The synchronization circuit LOOP provides an integer frequency-relationship between the stepped-frequency signal Ssf and the tuning oscillator LO. That is, if the stepped-frequency signal Ssf has a frequency Fsf, the tuning oscillator LO will operate at a frequency Flo=N·Fsf, N being an integer or an integer fraction.

Figure 2:
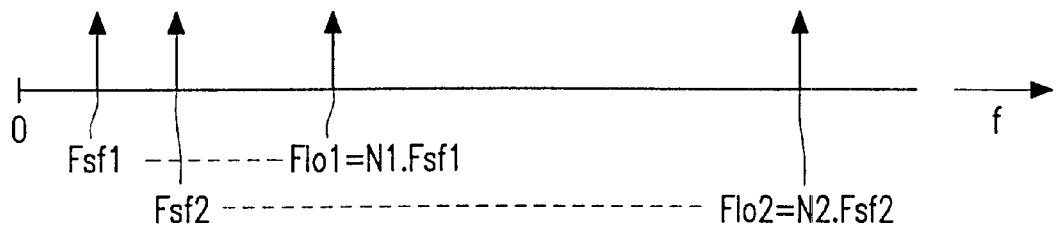
FIG. 2 is a frequency diagram depicting two different frequency relationships of the subject invention.

FIG. 2 illustrates the following additional feature. The integer frequency-relationship between the stepped-frequency signal and the tuning oscillator is adjustable. FIG. 2 is a frequency diagram which depicts two different integer frequency-relationships Flo1=N1·Fsf1 and Flo2=N2·Fsf2, Flo1 and Flo2 being possible tuning-oscillator frequencies, N1 and N2 being two different integer values, and Fsf1 and Fsf2 being two possible frequencies of the stepped-frequency signal.

The FIG. 2 feature takes the following aspects into consideration. The extent to which an oscillator can be tuned, on the one hand, and the spectral purity of the oscillator, on the other hand, are criteria which generally conflict with each other. If an oscillator needs to be tuned throughout a relatively wide frequency range, its frequency needs to change to a relatively large extent as a function of a frequency control signal. Consequently, the oscillator will be relatively sensitive to any disturbance in the frequency control signal, which disturbance may be noise or a signal leaking from another circuit.

If the FIG. 2 feature is applied, the frequency of the stepped-frequency signal needs to be varied throughout a smaller frequency range in order to tune the receiver throughout a desired band, than if the FIG. 2 feature is not applied. Consequently, any oscillator in the frequency-synthesizer circuit which provides the stepped-frequency signal needs to be tuned to a relatively small extent. This will be beneficial to the spectral purity of the stepped-frequency signal, on which the spectral purity of the tuning oscillator also depends, particularly if the synchronization circuit has a relatively large bandwidth. Thus, the FIG. 2 feature contributes to the tuning oscillator's spectral purity and, therefore, to the receiver's performance in terms of interference immunity.

Figure 3:
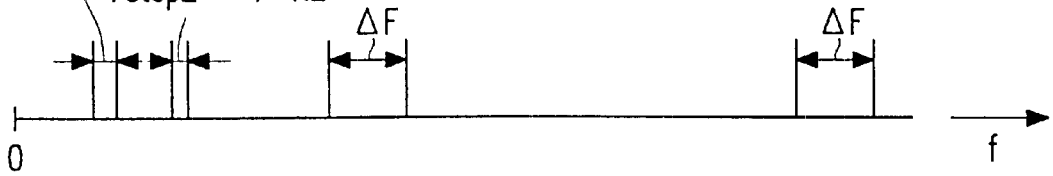
FIG. 3 is a frequency diagram depicting two different step sizes for varying the stepped-frequency signal.

FIG. 3 illustrates the following additional feature. The size of the steps in which the frequency of the stepped-frequency signal can be varied, is adjustable. FIG. 3 shows two different step-sizes Fstep1=ΔF÷N1 and Fstep2=ΔF÷N2, ΔF being a desired uniform tuning step-size. The FIG. 3 feature takes into consideration that the sizes of the steps in which the tuning-oscillator's frequency is varied, is equal to the sizes of the steps in which the stepped-frequency signal is varied, multiplied by the integer frequency-relationship between the tuning oscillator and the stepped-frequency signal. If the FIG. 2 feature is applied, the integer frequency-relationship will not be constant. The FIG. 3 feature allows compensation for this so as to achieve the desired uniform tuning step-size ΔF.

Figure 4:
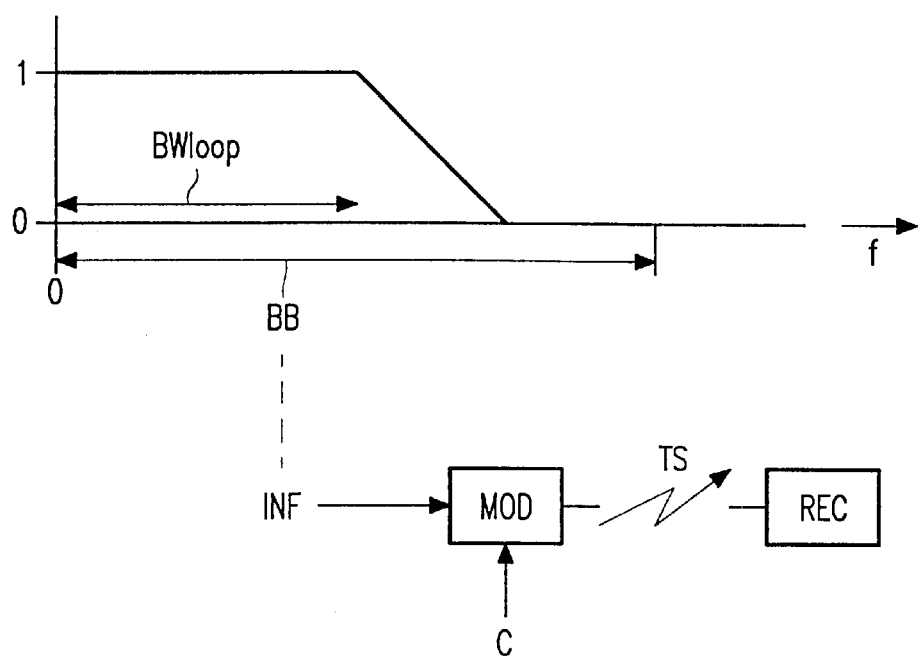
FIG. 4 is a frequency diagram depicting the bandwidth of the synchronization circuit.

FIG. 4 illustrates the following additional feature. The synchronization circuit has a bandwidth BWloop which covers at least a substantial portion of a typical baseband BB associated with a type of transmission signal which can be processed by the receiver. A transmission signal TS is usually formed by a carrier C which is modulated with information INF. The baseband BB is the frequency band occupied by the information INF which modulates the carrier C. As an example, an analog satellite television broadcast signal is a type of transmission signal which has a typical baseband of, say, 5 MHz. As another example, an FM-radio mono-broadcast signal is a type of transmission signal which has a typical baseband of, say, 15 kHz, whereas an FM-radio stereo-broadcast signal has a typical baseband of, say, 0 to 53 kHz.

FIG. 4 visualizes the bandwidth BWloop of the synchronization circuit by means of a graph. In the graph, the horizontal axis represents the frequency and the vertical axis indicates the extent to which the synchronization circuit reduces a synchronization error between the tuning oscillator and the stepped-frequency signal. The number 1 on the vertical axis means that the synchronization error is practically eliminated, the number 0 means that the synchronization error is not reduced. Synchronization errors which fall within the synchronization circuit's bandwidth BWloop are substantially eliminated, but synchronization errors which fall outside the synchronization circuits's bandwidth BWloop are not reduced or only to a relatively small extent.

The FIG. 4 feature takes the following aspects into consideration. In practice, the tuning oscillator will provide an output signal which comprises a certain amount of noise centered around the oscillation frequency. A frequency conversion in which the tuning oscillator takes part will effectively impose this tuning-oscillator noise on the transmission signal to which the receiver is tuned. This will adversely affect the extent to which the receiver is capable of correctly recovering the information transmitted. In particular, the tuning-oscillator noise which is within a baseband distance from the oscillation frequency, plays an important role in this respect.

If the FIG. 4 feature is applied, the tuning-oscillator noise within a baseband distance from the oscillation frequency will be substantially determined by the noise in the stepped-frequency signal. This is because the synchronization circuit imposes, as it were, the noise in the stepped-frequency signal which is within its bandwidth BWloop, on the tuning oscillator. Consequently, if the tuning oscillator by itself is noisier than the stepped-frequency signal, the synchronization circuit will effectively perform a noise clean-up action within its bandwidth. Thus, the FIG. 4 feature allows use of a relatively noisy tuning oscillator without a significant deterioration of the receiver's performance in terms of correctly recovering the information transmitted. It should be noted that this also applies in the case of a non-integer frequency-relationship between the stepped-frequency signal and the tuning oscillator.

Since the FIG. 4 feature allows use of a relatively noisy tuning oscillator, it also allows the following measures which generally worsen oscillator noise performance. The tuning oscillator may be wholly or partially realized in the form of an integrated circuit. Furthermore, it may also operate with a relatively low supply voltage and with a relatively small power consumption. All these factors contribute to reducing tuning-oscillator radiation which may cause interference problems. In particular, in a direct-conversion receiver, tuning-oscillator radiation needs to be relatively low so as to avoid problems of self-reception. Furthermore, if the tuning oscillator is wholly or partially included in an integrated circuit, it will be relatively easy to obtain mutually phase-shifted tuning-oscillator signals which are required in many types of receivers. As the tuning oscillator may operate with a relatively low supply voltage, it will generally not need a supply voltage which is different from that with which other circuitry operates. In summary, the FIG. 4 feature may contribute to cost-efficiency, low power consumption, and/or overcoming realization problems in many type of receivers.

Figure 5:
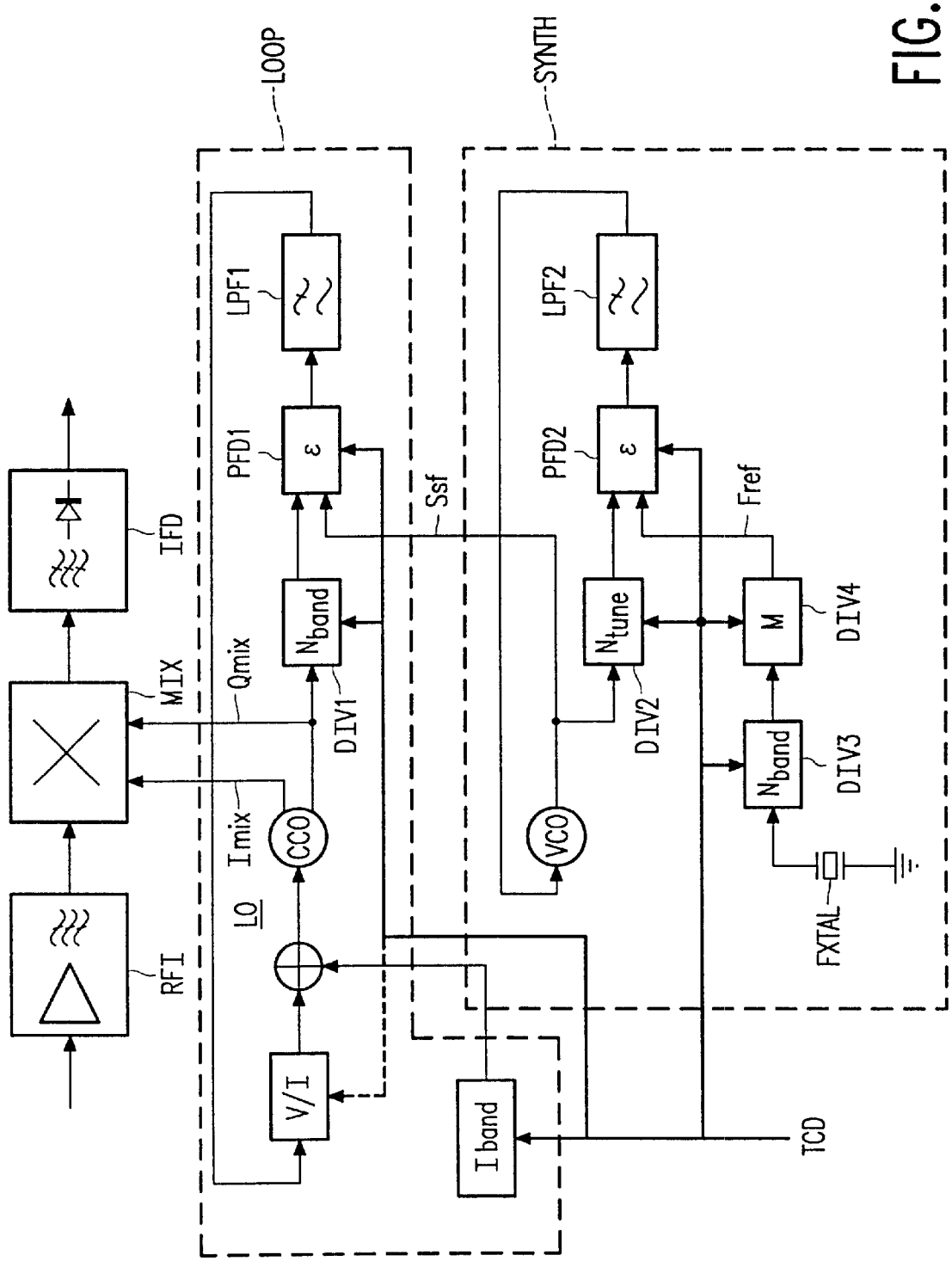
FIG. 5 is a block-schematic diagram of an example of a tuning system in accordance with the invention.

FIG. 5 illustrates an example of a receiver in accordance with the invention which includes the FIGS. 1–4 features described hereinbefore. In addition, the FIG. 5 receiver comprises an input circuit RFI, a mixer circuit MIX, and an intermediate frequency and demodulation circuit IFD. The mixer circuit MIX receives in-phase and quadrature mixing-signals Imix and Qmix from the tuning oscillator LO. The synthesizer circuit SYNTH and the synchronization circuit LOOP form, in combination, a tuning system which controls the frequency of the in-phase and quadrature mixing-signals Imix and Qmix in accordance with tuning command data TCD. The tuning command data TCD may be provided by a controller which is not shown in FIG. 5. The functions of the input circuit RFI, the mixer circuit MIX, and the intermediate frequency and demodulation circuit IFD will be clear to those skilled in the art. Therefore, these circuits are not further discussed hereinafter.

The synchronization circuit LOOP provides the following integer frequency-relation ship between the tuning oscillator LO and the stepped-frequency signal Ssf: Flo=Nband·Fsf. To this end, a programmable divider DIV1 divides an output signal of the tuning oscillator LO by a factor of Nband. Accordingly, a frequency-divided tuning oscillator signal is obtained whose frequency is Flo÷Nband. A phase/frequency detector PFD1 provides a synchronization error signal as a function of the synchronization error between the stepped-frequency signal Ssf and the frequency-divided tuning oscillator signal. The synchronization error signal is passed to the tuning oscillator LO via a loop filter LFP1 which has a relatively wide pass-band. The tuning oscillator LO is realized as an integrated RC-type oscillator which comprises a voltage-to-current converter V/I, a band-switching current source Iband and a current-controlled oscillator circuit CCO. The band-switching current source Iband may be used to coarsely tune the tuning oscillator LO to a certain frequency band, or a portion thereof, on the basis of the tuning command data TCD.

The frequency-synthesizer circuit SYNTH includes a voltage-controlled oscillator VCO which provides the stepped-frequency signal Ssf. A programmable divider DIV2 divides the frequency of the voltage-controlled oscillator's output signal by a factor of Ntune before it is supplied to a phase/frequency detector PFD2. The phase/frequency detector PFD also receives a signal providing an adjustable reference-frequency Fref which is obtained by carrying out two frequency divisions on a signal from a reference frequency source FXTAL. A programmable divider DIV3 carries out a first frequency division by the factor of Nband. A programmable divider DIV4 carries out a second frequency division by a factor of M. The phase/frequency detector provides, in response to the signals supplied thereto, a frequency control signal to the voltage-controlled oscillator VCO via a loop filter LPF2 which has a relatively narrow pass-band.

The controller, not shown in FIG. 5, calculates the respective division factors Nband, Ntune and M for the programmable dividers DIV1/DIV3, DIV2 and DIV4. The division factor Nband is such that the frequency-divided tuning oscillator signal, whose frequency is Flo÷Nband, falls within a frequency range through which the voltage-controlled oscillator VCO can be tuned. This frequency range may be relatively small if the division factor Nband is adjusted in accordance with the desired tuning-oscillator frequency Flo. In this way, a total frequency range through which the tuning oscillator LO should be tunable, can be effectively divided into different frequency subranges. Each frequency subrange is then associated with a division factor Nband. Since the division factor Nband is also used to divide the signal from the reference-frequency source FXTAL, a constant tuning step-size $\Delta F$ is achieved.

The other division factors Ntune and M are calculated on the basis of the following equations:

$$Ntune = Flo \cdot M \div Fxtal$$

$$M = Fxtal \div \Delta F$$

In these equations, Fxtal represents the frequency of the signal provided by the reference-frequency source FXTAL. It should be noted that the equations are simple mathematic operations that can be easily carried out by the controller. This fact contributes to a relatively easy and cost-efficient application of the FIG. 5 receiver.

The table below illustrates an application of the FIG. 5 receiver in the field of digital satellite TV-reception. Digital satellite TV-broadcasting takes place in a frequency range between, say, 950 MHz and 2150 MHz. With respect to the table below, it is assumed that the FIG. 5 receiver is of the direct-conversion type. The tuning oscillator LO is tuned throughout the frequency range between 950 MHz and 2150 MHz in 1 MHz steps. The 1 MHz steps may be obtained, for example, if the reference-frequency source FXTAL provides a 4 MHz signal and the division ratio M is 4. The rows of the table represent four frequency subranges SR1, SR2, SR3 and SR4 into which the frequency range between 950 MHz and 2150 MHz is effectively divided. The columns of the table list the following for each of the four frequency subranges SR1, SR2, SR3 and SR4: the frequency of the tuning oscillator Flo, the division factor Nband, the adjustable reference-frequency Fref, and the division factor Ntune, respectively.

|     | Flo (MHz)   | Nband | Fref (kHz) | Ntune     |
| --- | ----------- | ----- | ---------- | --------- |
| SR1 | 950–1228    | 4     | 250        | 950–1228  |
| SR2 | 1228–1535   | 5     | 200        | 1228–1535 |
| SR3 | 1535–1840   | 6     | 166.67     | 1535–1840 |
| SR4 | 1840–2150   | 7     | 142.85     | 1840–2150 |

The voltage-controlled oscillator VCO only needs to be tuned throughout a relative small frequency range between 237 MHz and 307 MHz.

Figure 6:
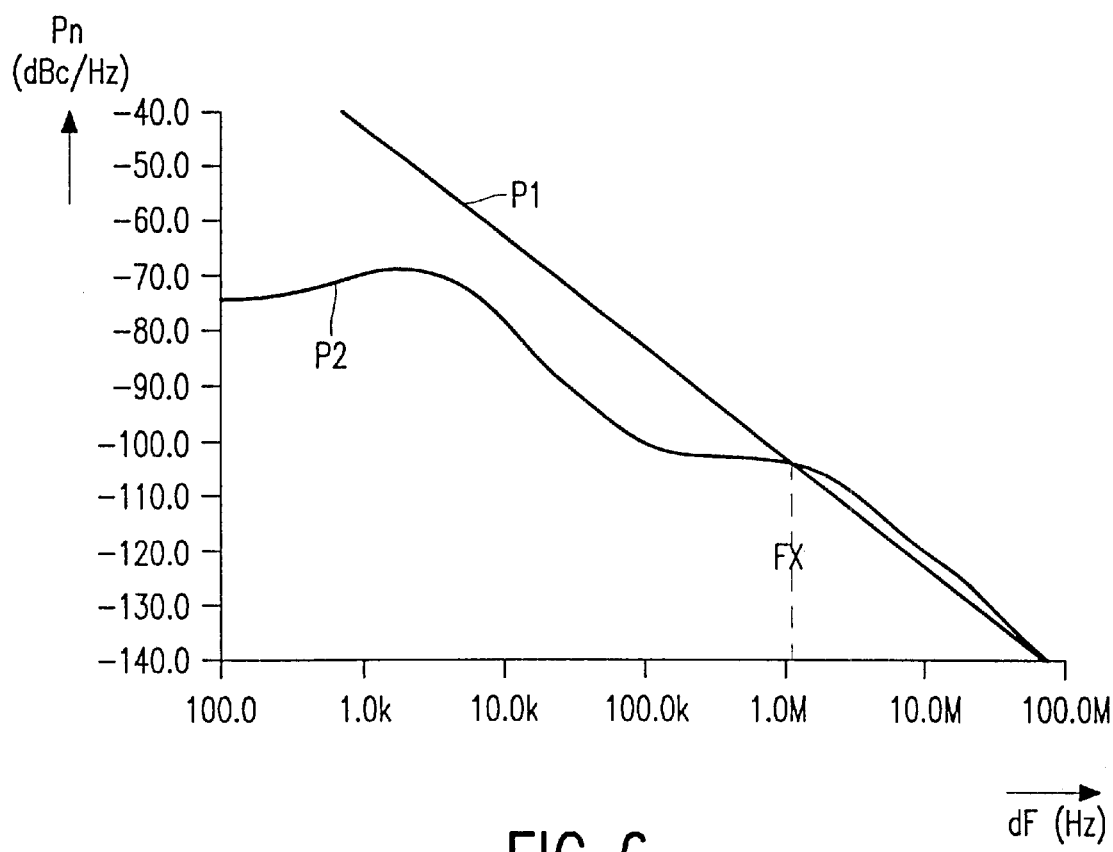
FIG. 6 is a graph illustrating the noise power spectral density versus distance in frequency of the tuning oscillator of FIG. 5.

FIG. 6 illustrates the noise behavior of the tuning oscillator LO in the above-described application of the FIG. 5 receiver. FIG. 6 is a graph of noise power spectral density Pn versus a distance in frequency dF with respect to the oscillation frequency. The noise power spectral density Pn is expressed in decibels with respect to the carrier power per Hertz (dBc/Hz). FIG. 6 shows two plots P1 and P2 which represent, respectively, the noise behavior of the tuning oscillator LO by itself, and the noise behavior when it forms part of the FIG. 5 receiver. FIG. 6 visualizes the noise clean-up action which the synchronization circuit LOOP carries out below a frequency FX. The frequency FX approximately corresponds to the bandwidth BWloop of the synchronization circuit LOOP.

The FIG. 5 receiver includes some additional features which have not been highlighted hereinbefore. The use of phase/frequency detectors contributes to a reliable and relatively fast operation of the FIG. 5 receiver. The use of phase/frequency detectors is also advantageous in terms of spectral purity, because phase/frequency detectors produce relatively few spurious products. European Patent Application 96202486.5, corresponding to U.S. patent application Ser. No. 08/923,048, filed Sep. 3, 1997, which is herein incorporated by reference, describes suitable phase/frequency detectors. Another additional feature, which is included in the FIG. 5 receiver, is that the phase/frequency detectors have programmable characteristics. That is, the magnitude of the output signal for a certain synchronization error is adjustable. Accordingly, a change in the frequency division factors of programmable dividers DIV1 and DIV2 may be compensated for so as to keep the bandwidth BWloop of the synchronization circuit LOOP, and that of the synthesizer circuit SYNTH, substantially constant. This may be important, because in many applications the bandwidth is a delicate compromise between various performance aspects.

The drawings and their description hereinbefore illustrate rather than limit the invention. Evidently, there are numerous alternatives which fall within the scope of the appended Claims. In this respect, the following closing remarks are made.

There are numerous ways of physically spreading functions or functional elements over various units. In this respect, the drawings are very diagrammatic and represent only one possible embodiment of the invention.

What is claimed is:

1. A receiver comprising a tuning system for tuning the receiver, the tuning system comprising:
    a frequency-synthesis circuit for generating a stepped-frequency signal having a frequency varying in steps with a step size; and
    a synchronization circuit for synchronizing a tuning oscillator to the stepped-frequency signal to form a tuning frequency, said synchronization circuit comprising means for providing an adjustable integer frequency relationship between the stepped-frequency signal and the tuning frequency, characterized in that the frequency-synthesis circuit comprises means for varying the step size of the stepped-frequency signal in dependence on the adjustable integer frequency relationship such that the synchronization circuit forms the tuning frequency having substantially uniform tuning steps.

2. A receiver as claimed in claim 1, characterized in that the synchronization circuit has a bandwidth covering at least a substantial portion of a typical baseband associated with a type of transmission signal processable by the receiver.

3. A receiver as claimed in claim 1, characterized in that the synchronization circuit includes a phase/frequency detector for providing a frequency control signal to the tuning oscillator as a function of a synchronization error between the stepped-frequency signal and the tuning oscillator.

4. A receiver as claimed in claim 3, characterized in that a relation between the frequency control signal and the synchronization error is adjustable.

5. A tuning system comprising:
    a frequency-synthesis loop for generating a stepped-frequency signal having a frequency varying in steps with a step size; and
    a synchronization circuit for synchronizing a tuning oscillator to the stepped-frequency signal to form a tuning frequency, said synchronization circuit comprising means for providing an adjustable integer frequency relationship between the stepped-frequency signal and the tuning frequency, characterized in that the frequency-synthesis circuit comprises means for varying the step size of the stepped-frequency signal in dependence on the adjustable integer frequency relationship such that the synchronization circuit forms the tuning frequency having substantially uniform tuning steps.

6. A method of tuning comprising the steps:
    generating a stepped-frequency signal having a frequency varying in steps with a step size;
    synchronizing a tuning oscillator to the stepped-frequency signal to form a tuning frequency; and
    providing an adjustable integer frequency relationship between the stepped-frequency signal and the tuning frequency, characterized in that the method of tuning further comprises the step:
    varying the step size of the stepped-frequency signal in dependence on the adjustable integer frequency relationship to form the tuning frequency having substantially uniform tuning steps.

* * * * *

UNITED STATES PATENT AND TRADEMARK OFFICE
CERTIFICATE OF CORRECTION

PATENT NO. : 6,665,523 B1
DATED : December 16, 2003
INVENTOR(S) : Kasperkovitz et al.

It is certified that error appears in the above-identified patent and that said Letters Patent is hereby corrected as shown below:

Title page,
Item [*] Notice, delete "0" and insert -- 835 --

Signed and Sealed this

Second Day of August, 2005

JON W. DUDAS
*Director of the United States Patent and Trademark Office*